(12) United States Patent
Goto (10) Patent No.: US 9,143,713 B2
(45) Date of Patent: Sep. 22, 2015

(54) SOLID-STATE IMAGING DEVICE AND IMAGING APPARATUS

(71) Applicant: FUJIFILM CORPORATION, Tokyo (JP)

(72) Inventor: Takashi Goto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 176 days.

(21) Appl. No.: 14/038,391

(22) Filed: Sep. 26, 2013

(65) Prior Publication Data

US 2014/0027618 A1 Jan. 30, 2014

Related U.S. Application Data

(63) Continuation of application No. PCT/JP2011/076558, filed on Nov. 17, 2011.

(30) Foreign Application Priority Data

Mar. 29, 2011 (JP) .................. 2011-072364

(51) Int. Cl.
  *H01L 27/00* (2006.01)
  *H04N 5/378* (2011.01)
  *H01L 27/146* (2006.01)
(52) U.S. Cl.
  CPC .......... *H04N 5/378* (2013.01); *H01L 27/14603* (2013.01); *H01L 27/14609* (2013.01); *H01L 27/14641* (2013.01)
(58) Field of Classification Search
  CPC ................................. H01L 27/14603

USPC ...................................................... 250/208.1
See application file for complete search history.

(56) References Cited

U.S. PATENT DOCUMENTS

| 6,160,281 A | 12/2000 | Guidash |
| 2007/0057339 A1 | 3/2007 | Mitsui et al. |
| 2008/0083925 A1* | 4/2008 | Suzuki ............................ 257/59 |
| 2008/0088724 A1 | 4/2008 | Kudoh |

FOREIGN PATENT DOCUMENTS

| JP | H10-256521 A | 9/1998 |
| JP | 2007-081137 A | 3/2007 |
| JP | 2007-103786 A | 4/2007 |
| JP | 2008-124237 A | 5/2008 |

* cited by examiner

*Primary Examiner* — Thanh Luu
(74) *Attorney, Agent, or Firm* — Studebaker & Brackett PC (57) ABSTRACT

The invention is directed to a solid-state imaging device in which pixels each including a photoelectric conversion portion formed above a semiconductor substrate and an MOS type signal reading circuit as defined herein are arranged in an array form, wherein: the photoelectric conversion portion includes a pixel electrode, a counter electrode and a photoelectric conversion layer as defined herein; a bias voltage is applied to the counter electrode as defined herein; the signal reading circuit includes a charge storage portion, an output transistor and a protection circuit as defined herein; the protection circuit has an impurity region as defined herein; the output transistor has an impurity region as defined herein; and the impurity regions of the protection circuits and the impurity regions of the output transistors are used in common to every adjacent two of the pixels as defined herein.

10 Claims, 13 Drawing Sheets

SOLID-STATE IMAGING DEVICE AND IMAGING APPARATUS

CROSS REFERENCE TO RELATED APPLICATION

This is a continuation of International Application No. PCT/JP2011/076558 filed on Nov. 17, 2011, and claims priority from Japanese Patent Application No. 2011-072364 filed on Mar. 29, 2011, the entire disclosures of which are incorporated herein by reference.

TECHNICAL FIELD

The present invention relates to a solid-state imaging device in which pixels each including a photoelectric conversion portion formed above a semiconductor substrate and an MOS type signal reading circuit formed at the semiconductor substrate to read out a signal corresponding to electric charges generated in the photoelectric conversion portion are arranged in an array form, and an imaging apparatus including the solid-state imaging device.

BACKGROUND ART

In order to support higher sensitivity of a solid-state imaging device and increase in the number of pixels in recent years, a photoelectric conversion layer stack type solid-state imaging device in which a photoelectric conversion portion including a pair of electrodes and a photoelectric conversion layer sandwiched between the pair of electrodes is provided above a silicon substrate so that electric charges generated in the photoelectric conversion layer are moved from one of the pair of electrodes to the silicon substrate and stored in the silicon substrate and a signal corresponding to the stored electric charges is read out by a signal reading circuit formed at the silicon substrate, has attracted much attention (see Patent Literature 1).

A configuration in which holes of the electric charges generated in the photoelectric conversion layer above the silicon substrate are stored in a charge storage portion in the silicon substrate and a signal corresponding to the holes stored in the charge storage portion is read out by the signal reading circuit in the photoelectric conversion layer stack type solid-state imaging device has been disclosed in Patent Literature 1. With such a configuration, sensitivity can be prevented from being lowered and spectral sensitivity can be prevented from being broadened even when an organic material is used for the photoelectric conversion layer.

In the solid-state imaging device according to Patent Literature 1, holes generated in the photoelectric conversion layer are stored in the charge storage portion made from a p-type impurity layer in the silicon substrate and a signal corresponding to the holes is read out by a p-channel MOS transistor. Alternatively, various systems are conceived as systems for reading out the signal corresponding to the holes. For example, there is conceived a configuration in which holes generated in the photoelectric conversion layer are stored in a charge storage portion made from an n-type impurity layer in the silicon substrate and a signal corresponding to the holes is read out by an n-channel MOS transistor.

However, in this configuration, there is a possibility that the potential of the charge storage portion will increase up to a voltage high enough to break down the n-channel MOS transistor or the like when excessive light is incident on the photoelectric conversion layer. In order to prevent the breakdown, a configuration in which a protection circuit is provided in the signal reading circuit has been described in Patent Literature 2.

PRIOR ART DOCUMENTS

Patent Literature

Patent Literature 1: JP-A-2007-81137
Patent Literature 2: JP-A-2007-103786

SUMMARY OF INVENTION

Problems to be Solved by the Invention

Due to the protection circuit provided in the signal reading circuit according to Patent Literature 2, the size of each pixel increases. Since reduction in pixel size is required in order to support increase in the number of pixels, there is a demand for a technique which can introduce a protection circuit without causing increase in pixel size. However, in Patent Literature 2, there is no consideration about reduction in pixel size.

The invention has been accomplished in consideration of the aforementioned circumstances. An object of the invention is to provide a stack type solid-state imaging device which can be prevented from malfunction when excessive light is incident thereto and in which the size of each pixel can be reduced, and an image apparatus including the stack type solid-state imaging device.

Means for Solving the Problems

The solid-state imaging device according to the invention is a solid-state imaging device including pixels arranged in an array form and each including a photoelectric conversion portion formed above a semiconductor substrate and an MOS type signal reading circuit formed at the semiconductor substrate to read out a signal corresponding to electric charges generated in the photoelectric conversion portion, wherein: the photoelectric conversion portion includes a pixel electrode formed above the semiconductor substrate and split in accordance with each of the pixels, a counter electrode formed above the pixel electrode, and a photoelectric conversion layer formed between the pixel electrode and the counter electrode; a bias voltage higher than a power supply voltage of the signal reading circuit is applied to the counter electrode so that holes of the electric charges generated in the photoelectric conversion layer move to the pixel electrode; the signal reading circuit includes a charge storage portion formed in the semiconductor substrate so that holes moved to the pixel electrode are stored in the charge storage portion, an output transistor having a gate electrode electrically connected to the charge storage portion and outputting a signal corresponding to the potential of the charge storage portion, and a protection circuit which prevents the potential of the gate electrode from exceeding a predetermined value; the protection circuit has an impurity region formed in the semiconductor substrate and connected to a power supply; the output transistor has an impurity region formed in the semiconductor substrate and connected to the power supply; and the impurity regions of the protection circuits and the impurity regions of the output transistors are common to every adjacent two of the pixels so that two impurity regions formed in the semiconductor substrate and connected to the power supply are present for the adjacent two pixels.

An imaging apparatus according to the invention includes the solid-state imaging device.

Effects of Invention

According to the invention, it is possible to provide a stack type solid-state imaging device which can be prevented from malfunction when excessive light is incident thereto and in which the size of each pixel can be reduced, and an imaging apparatus including the stack type solid-state imaging device.

EMBODIMENTS FOR CARRYING OUT THE INVENTION

A photoelectric conversion layer stack type solid-state imaging device for explaining an embodiment of the invention will be described below with reference to the drawings. The solid-state imaging device which will be described below has a plurality of pixels which are arranged in a two-dimensional array form. Each of the pixels includes a photoelectric conversion portion formed above a semiconductor substrate, and an MOS type signal reading circuit formed at the semiconductor substrate to read out a signal corresponding to electric charges generated in the photoelectric conversion portion. Part of impurity regions for a device forming the signal reading circuit are used in common to adjacent two of the pixels. With such a configuration, the size of each pixel can be reduced.

First, a presupposed configuration of one of pixels in a solid-state imaging device described in the embodiment will be described.

Figure 1:
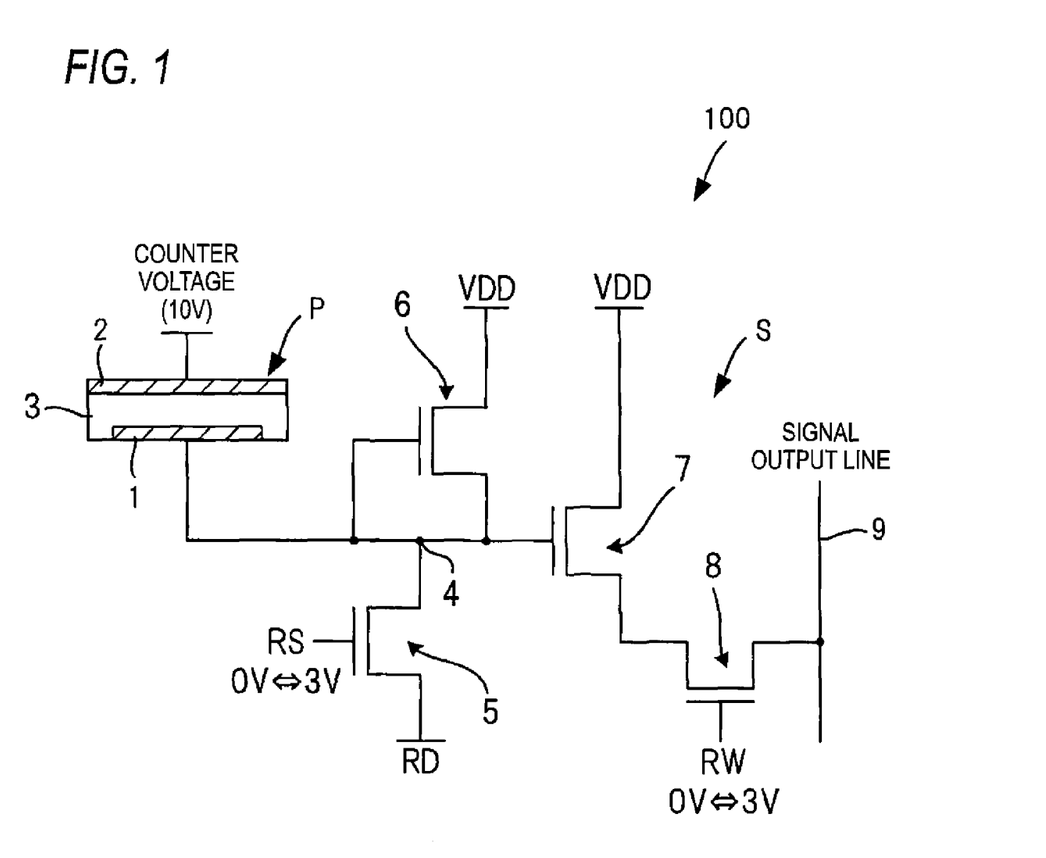
FIG. 1 A diagram showing a fundamental configuration of one of pixels in a photoelectric conversion layer stack type solid-state imaging device for explaining an embodiment of the invention.

FIG. 1 is a view showing a fundamental configuration of one of pixels in a photoelectric conversion layer stack type solid-state imaging device for explaining an embodiment of the invention.

A pixel 100 shown in FIG. 1 has a photoelectric conversion portion P formed above a semiconductor substrate of silicon or the like, and an MOS type signal reading circuit S formed at the semiconductor substrate.

The photoelectric conversion portion P includes a pixel electrode 1 formed above the semiconductor substrate, a counter electrode 2 formed above the pixel electrode 1, and a photoelectric conversion layer 3 provided between the pixel electrode 1 and the counter electrode 2.

Light is incident on the counter electrode 2 from above. Since light needs to be incident on the photoelectric conversion layer 3, the counter electrode 2 is made from a conductive material such as ITO transparent to the incident light. Although the counter electrode 2 is formed as a sheet common to all the pixels 100, the counter electrode 2 may be split in accordance with each pixel 100.

The pixel electrode 1 is a thin-film electrode split in accordance with each pixel 100. The pixel electrode 1 is made from a transparent or opaque conductive material (such as ITO, aluminum or titanium nitride).

The photoelectric conversion layer 3 is a layer which is formed to include an organic or inorganic photoelectric conversion material which absorbs a specific wavelength region of incident light and generates electric charges corresponding to the quantity of the absorbed light. A charge blocking layer for suppressing injection of electric charges from the electrode into the photoelectric conversion layer 3 may be provided between the photoelectric conversion layer 3 and the counter electrode 2 or between the photoelectric conversion layer 3 and the pixel electrode 1.

A bias voltage is applied to the counter electrode 2 so that holes of the electric charges generated in the photoelectric conversion layer 3 move to the pixel electrode 1 while electrons move to the counter electrode 2. A voltage (about 5V to 20V, for example, 10V) higher than a power supply voltage VDD (for example, 3V) of the signal reading circuit S is used as the bias voltage so that the photoelectric conversion layer 3 can exhibit satisfactorily high sensitivity.

The signal reading circuit S has a charge storage portion 4, a reset transistor 5, an output transistor 7, a row selection transistor 8, and a protection transistor 6. The charge storage portion 4 is electrically connected to the pixel electrode 1 and made from an impurity region in which holes moved to the pixel electrode 1 are stored. The reset transistor 5 is provided for resetting the potential of the charge storage portion 4 to a predetermined reset potential. The output transistor 7 has a gate electrode connected to the charge storage portion 4 so that a signal corresponding to the potential of the charge storage portion 4 is outputted by the output transistor 7. The row selection transistor 8 selectively outputs the signal outputted from the output transistor 7, to a signal output line 9. The protection transistor 6 serves as a protection circuit for preventing the potential of the gate electrode of the output transistor 7 from exceeding a predetermined value.

Figure 2:
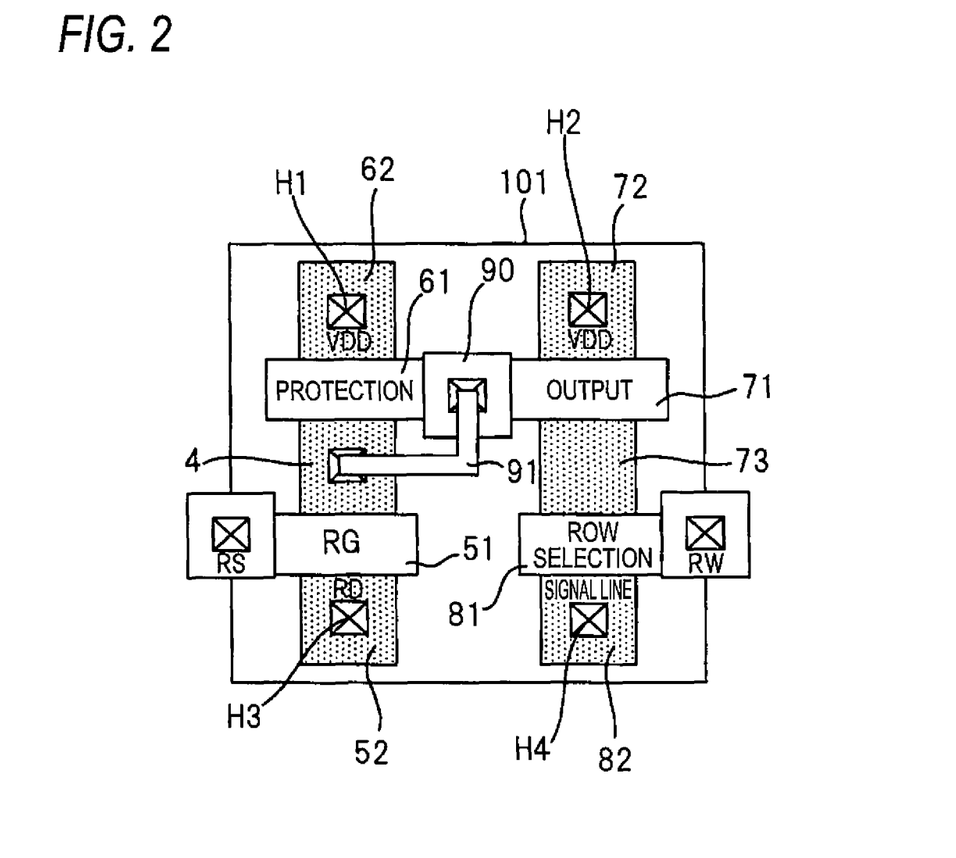
FIG. 2 A view showing a planar layout of the pixel shown in FIG. 1.

FIG. 2 is a planar schematic view showing a layout example in the case where impurity regions are exclusively provided for a device forming the signal reading circuit S in the pixel shown in FIG. 1. Hatched regions in FIG. 2 designate n-type impurity regions formed in the semiconductor substrate for the device forming the signal reading circuit S.

As shown in FIG. 2, a region 101 where the signal reading circuit S is formed is rectangular. The area of the rectangle 101 is regarded as the size of the pixel 100.

A source region 62 of the protection transistor 6 is formed in the upper left of the rectangular region 101.

A drain region 72 of the output transistor 7 is formed in the upper right of the rectangular region 101.

A drain region 52 of the reset transistor 5 is formed in the lower left of the rectangular region 101.

A source region 82 of the row selection transistor 8 is formed in the lower right of the rectangular region 101.

The charge storage portion 4 is formed between the source region 62 and the drain region 52.

An impurity region 73 serving as a source region of the output transistor 7 and as a drain region of the row selection transistor 8 is formed between the drain region 72 and the source region 82.

A gate electrode 61 (indicated as "protection" in FIG. 2) of the protection transistor 6 is formed on the semiconductor substrate between the charge storage portion 4 and the source region 62 through an insulating film not shown.

A gate electrode 71 (indicated as "output" in FIG. 2) of the output transistor 7 is formed on the semiconductor substrate between the impurity region 73 and the drain region 72 through an insulating film not shown.

The gate electrode 61 of the protection transistor 6 and the gate electrode 71 of the output transistor 7 may be formed of the same material so as to be integrated with each other or may be formed separately. A conductive member 90 is connected to the gate electrode 61 of the protection transistor 6 and the gate electrode 71 of the output transistor 7. The conductive member 90 and the charge storage portion 4 are electrically connected to each other by a wire 91.

A wire H1 is connected to the source region 62 of the protection transistor 6. This wire H1 is connected to a power supply which supplies a power supply voltage VDD to the protection transistor 6.

A wire H2 is connected to the drain region 72 of the output transistor 7. The wire H2 is connected to the power supply (the same power supply as the power supply connected to the source region 62 of the protection transistor 6) which supplies the power supply voltage VDD to the output transistor 7.

A gate electrode 51 (indicated as "RG" in FIG. 2) of the reset transistor 5 is formed on the semiconductor substrate between the charge storage portion 4 and the drain region 52 through an insulating film not shown.

A gate electrode 81 (indicated as "row selection" in FIG. 2) of the row selection transistor 8 is formed on the semiconductor substrate between the impurity region 73 and the source region 82 through an insulating film not shown.

A reset control line RS is connected to the gate electrode 51 of the reset transistor 5.

A row selection control line RW is connected to the gate electrode 81 of the row selection transistor 8.

A wire H3 is connected to the drain region 52 of the reset transistor 5. A reset power supply is connected to the wire H3.

A wire H4 is connected to the source region 82 of the row selection transistor 8. The signal output line 9 shown in FIG. 1 is connected to the wire H4.

Since the source region 62 of the protection transistor 6 and the drain region 72 of the output transistor 7 in the signal reading circuit S are impurity regions to which the same power supply is connected, the source region 62 and the drain region 72 can be used in common with each other in the pixel 100.

However, when the source region 62 of the protection transistor 6 and the drain region 72 of the output transistor 7 are used in common with each other in the pixel 100, the layout for other devices will be difficult to thereby result in increase in pixel size. For that reason, it is preferable that the layout shown in FIG. 2 is used in the case where impurity regions for a device forming the signal reading circuit S are provided exclusively in one pixel 100.

When the pixel layout shown in FIG. 2 is set forth as a premise, part of impurity regions for devices forming the signal reading circuits S can be easily used in common to two adjacent pixels 100, so that the size of each pixel can be further reduced. Specific examples in which part of impurity regions for devices forming the signal reading circuits S are used in common to two adjacent pixels 100 will be described as follows.

First Layout Example

Figure 3:
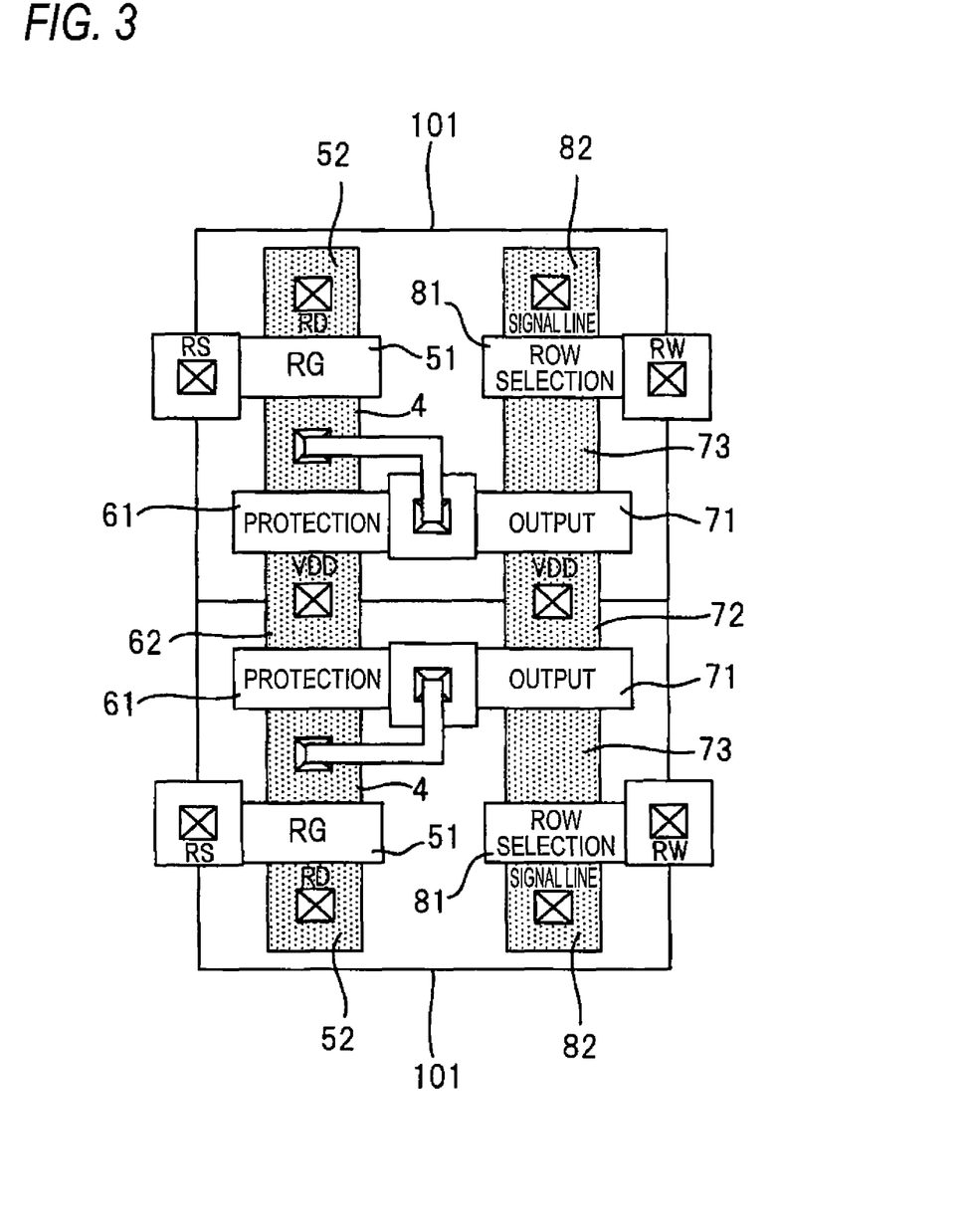
FIG. 3 A view showing a layout example in the case where impurity regions for devices forming signal reading circuits in a solid-state imaging device in which pixels 100 shown in FIG. 1 are arranged in an array form are used in common.
Figure 4:
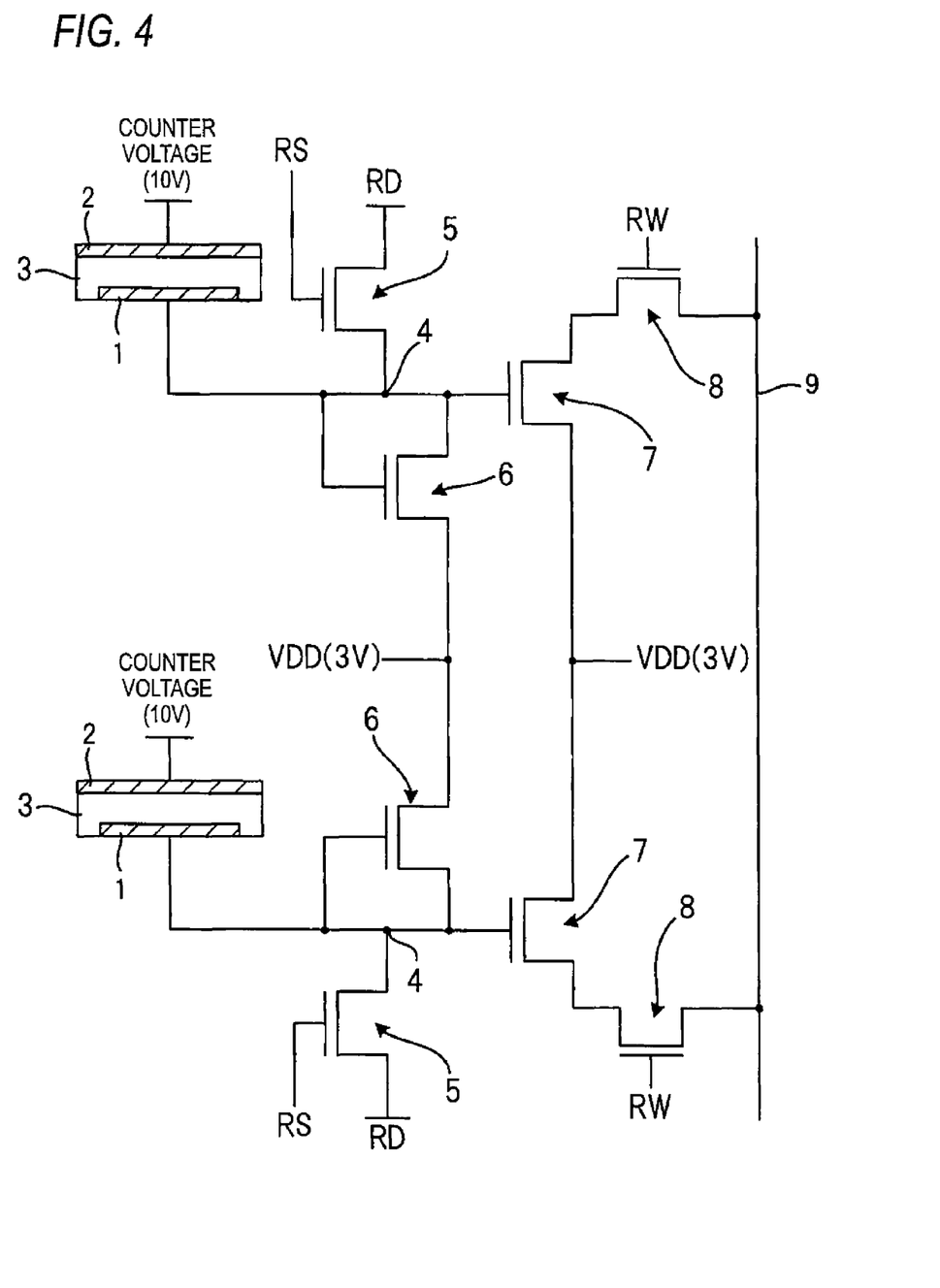
FIG. 4 A circuit diagram of two pixels 100 shown in FIG. 3.

FIG. 3 is a view showing a layout example in the case where impurity regions for devices forming signal reading circuits in a solid-state imaging device in which a plurality of pixels 100 shown in FIG. 1 are arranged in an array form are used in common. FIG. 3 shows a planar layout example of the signal reading circuits S of two longitudinally adjacent pixels 100. FIG. 4 is a circuit diagram of the two pixels 100 shown in FIG. 3. In FIG. 3, reference signs for the wires H1 to H4 are omitted.

In the layout of FIG. 3, a pixel 100 of FIG. 2 and a pixel 100 obtained by turning the layout of FIG. 2 upside down are arranged so that the gate electrodes 61 of the protection transistors 6 are opposed to each other and the gate electrodes 71 of the output transistors 7 are opposed to each other. Further, the source regions 62 of the protection resistors 6 in the two pixels 100 are used in common with each other, and the drain regions 72 of the output transistors 7 in the two pixels 100 are used in common with each other.

As shown in FIG. 3, when two pixels shown in FIG. 2 are arranged while inverted to each other with respect to the source regions of the protection transistors 6 and the drain regions of the output transistors 7, the source regions of the protection transistors 6 in the two pixels can be used in common with each other and the drain regions of the output transistors 7 in the two pixels can be used in common with each other. According to this layout, the area for each pixel 100 can be reduced by 17% compared with the case (the layout of FIG. 2) where part of impurity regions for devices forming signal reading circuits S are not used in common to two adjacent pixels 100.

Figure 5:
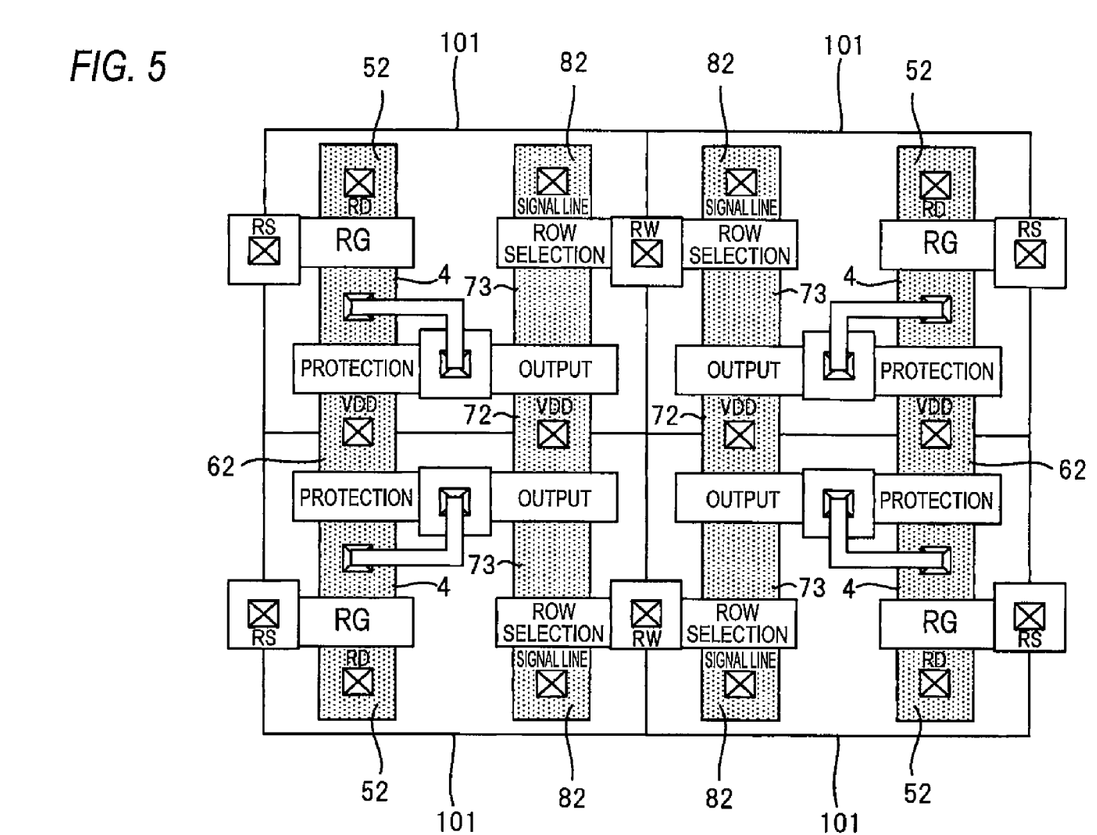
FIG. 5 A view showing a planar layout example of 2×2 pixels using the layout of FIG. 3.

FIG. 5 is a view showing a layout example of 2×2 pixels using the layout of FIG. 3. In FIG. 5, reference signs for the wires H1 to H4 and the gate electrodes of the respective transistors are omitted.

In the layout of FIG. 5, two pixels 100 having a layout obtained by laterally inverting two pixels 100 shown in FIG. 3 are disposed on the right of the two pixels 100 shown in FIG. 3, and row selection control lines RW are used in common to two laterally adjacent pixels 100. In FIG. 5, the gate electrodes of the row selection transistors 8 in the two laterally arranged pixels may be united into one body. According to the layout of FIG. 5, the size of each pixel can be further reduced.

Second Layout Example

Figure 6:
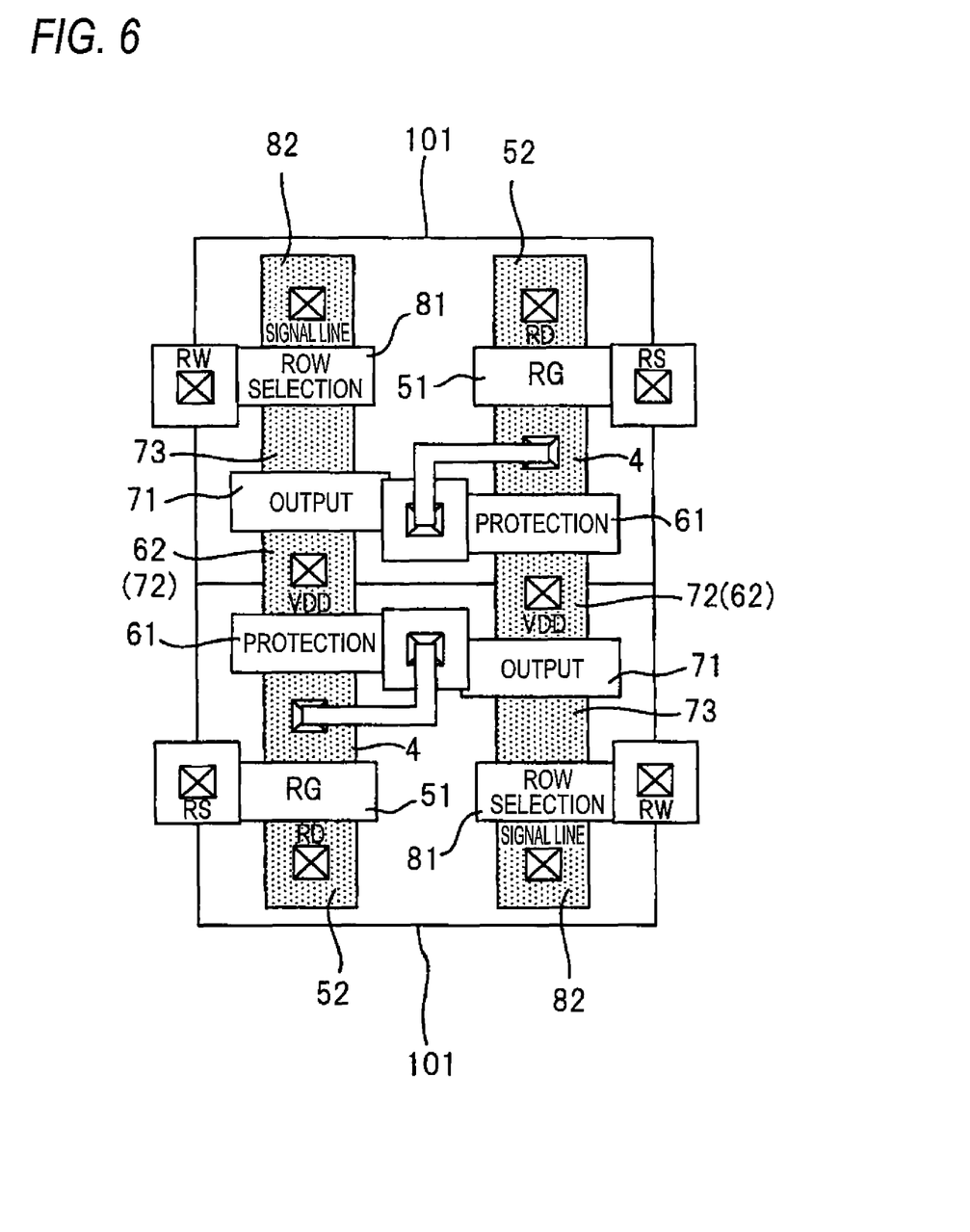
FIG. 6 A view showing a layout example in the case where impurity regions for devices forming signal reading circuits in a solid-state imaging device in which pixels 100 shown in FIG. 1 are arranged in an array form are used in common.
Figure 7:
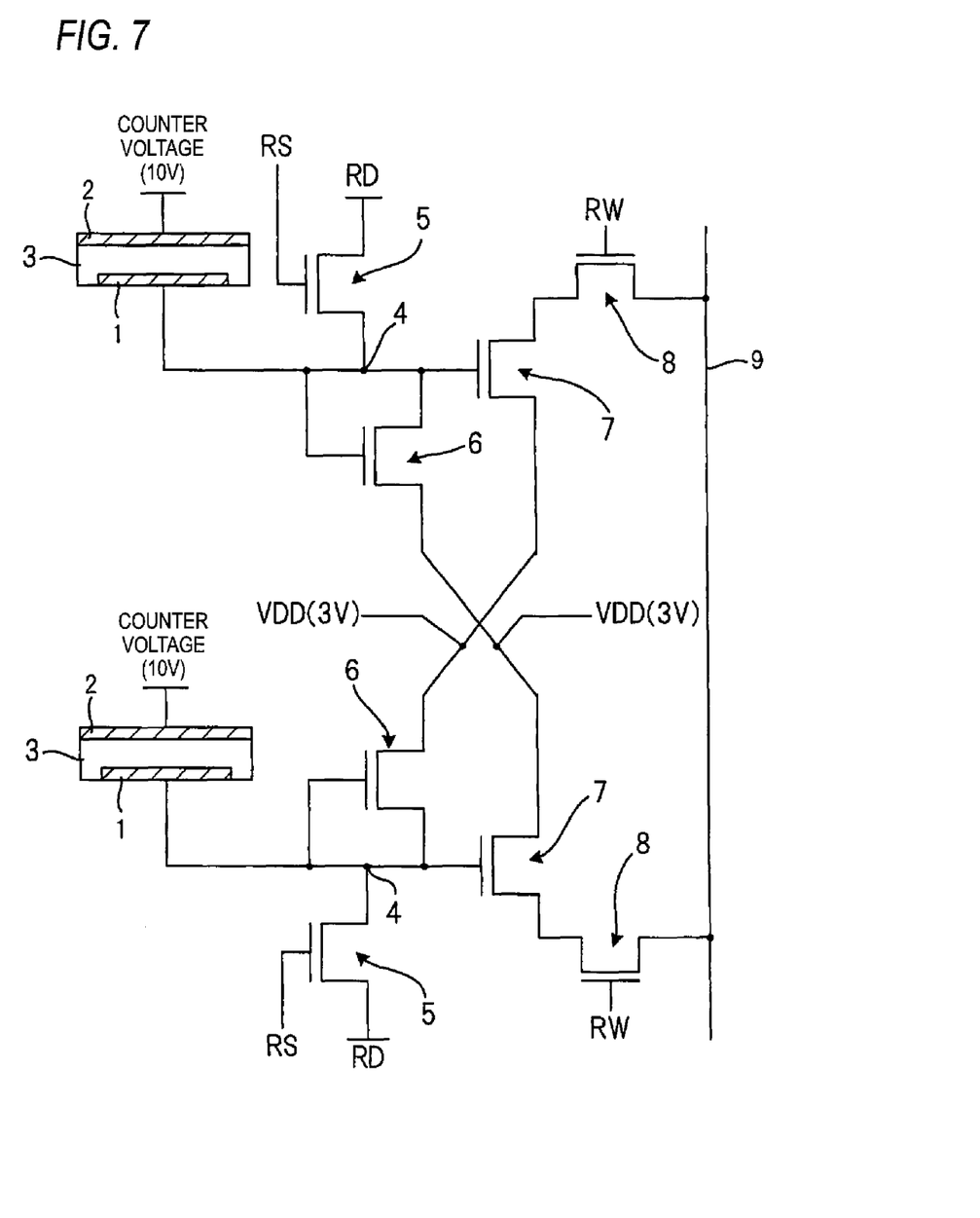
FIG. 7 A circuit diagram of two pixels 100 shown in FIG. 6.

FIG. 6 is a view showing a layout example in the case where part of impurity regions for devices forming signal reading circuits S in a solid-state imaging device in which a plurality of pixels 100 shown in FIG. 1 are arranged in an array form are used in common. FIG. 6 shows a planar layout example of the signal reading circuits S in two longitudinally adjacent pixels 100. FIG. 7 is a circuit diagram of the two pixels 100 shown in FIG. 6. In FIG. 6, reference signs for the wires H1 to H4 are omitted.

In the layout of FIG. 6, a pixel 100 having the layout of FIG. 2 and a pixel 100 having a layout obtained by rotating the layout of FIG. 2 by 180 degrees are arranged so that the gate electrodes 61 of the protection transistors 6 are opposed to the gate electrodes 71 of the output transistors 7 respectively. Further, of the two pixels 100, the source region 62 of the protection transistor 6 in the pixel 100 disposed on the upper side and the drain region 72 of the output transistor 7 in the pixel 100 disposed on the lower side are used in common with each other while the drain region 72 of the output transistor 7 in the pixel 100 disposed on the upper side and the source region 62 of the protection transistor 6 in the pixel 100 disposed on the lower side are used in common with each other.

In FIG. 6, the gate electrodes 71 of the output transistors 7 in the two pixels 100 are shifted toward the gate electrodes 81 of the row selection transistors 8 so that the area of each impurity region 73 becomes smaller than that in FIG. 2. Since each of the impurity regions 62 and 72 has the same size as that in the layout of FIG. 2, the area of each pixel 100 according to the layout of FIG. 6 can be reduced by 20% due to the reduced size of each impurity region 73, compared with the layout of FIG. 2.

Also in the layout of FIG. 3, the gate electrodes 71 can be shifted to reduce the size of each impurity region 73. However, since it is difficult to reduce the area of each impurity region any more in the semiconductor substrate where the wires are connected, it is difficult to reduce the areas of the drain regions 52, the charge storage portions 4 and the source regions 62 in FIG. 3. Accordingly, even if the size of each impurity region 73 can be reduced, it is still difficult to reduce the size of each pixel any more because the longitudinal length of each rectangular region 101 is unchanged.

On the other hand, according to the layout of FIG. 6, the areas of the impurity regions 73 are reduced. As a result, it is easy to shorten each rectangular region 101 longitudinally, so that the area of the rectangular region 101 can be reduced. In this manner, according to the layout of FIG. 6, the size of each pixel can be reduced compared with the layout of FIG. 3.

As shown in FIG. 6, two pixels shown in FIG. 2 are arranged in such a manner that one of the two pixels is rotated by 180 degrees relative to the other pixel. Thus, the source regions of the protection transistors 6 can be used in common with the drain regions of the output transistors 7 respectively in the two pixels, so that the size of each pixel can be reduced.

Figure 8:
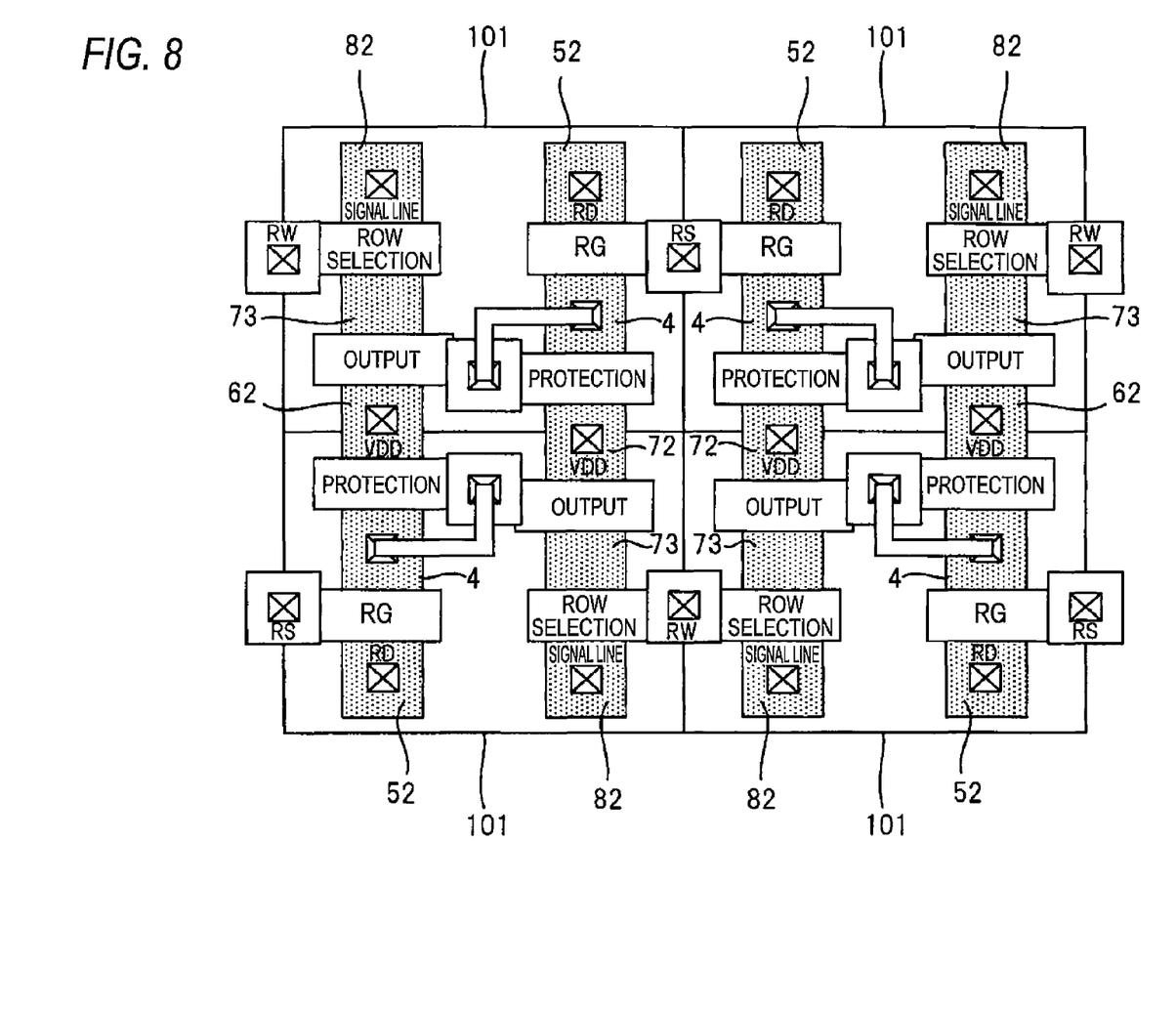
FIG. 8 A view showing a planar layout example of 2×2 pixels using the layout of FIG. 6.

FIG. 8 is a view showing a layout example of 2×2 pixels using the layout of FIG. 6. In FIG. 8, reference signs for the wires H1 to H4 and the gate electrodes of the respective transistors are omitted.

In the layout of FIG. 8, two pixels 100 obtained by laterally inverting two pixels 100 shown in FIG. 6 are disposed on the right of the two pixels 100 shown in FIG. 6, and the row selection control lines RW and the reset control lines RS are used in common to the two laterally adjacent pixels 100. In FIG. 8, the gate electrodes of the row selection transistors 8 and the gate electrodes of the reset transistors 5 in the two laterally arranged pixels 100 may be formed integrally. According to the layout of FIG. 8, the pixels can be integrated efficiently, so that increase in the number of pixels can be achieved.

Figure 9:
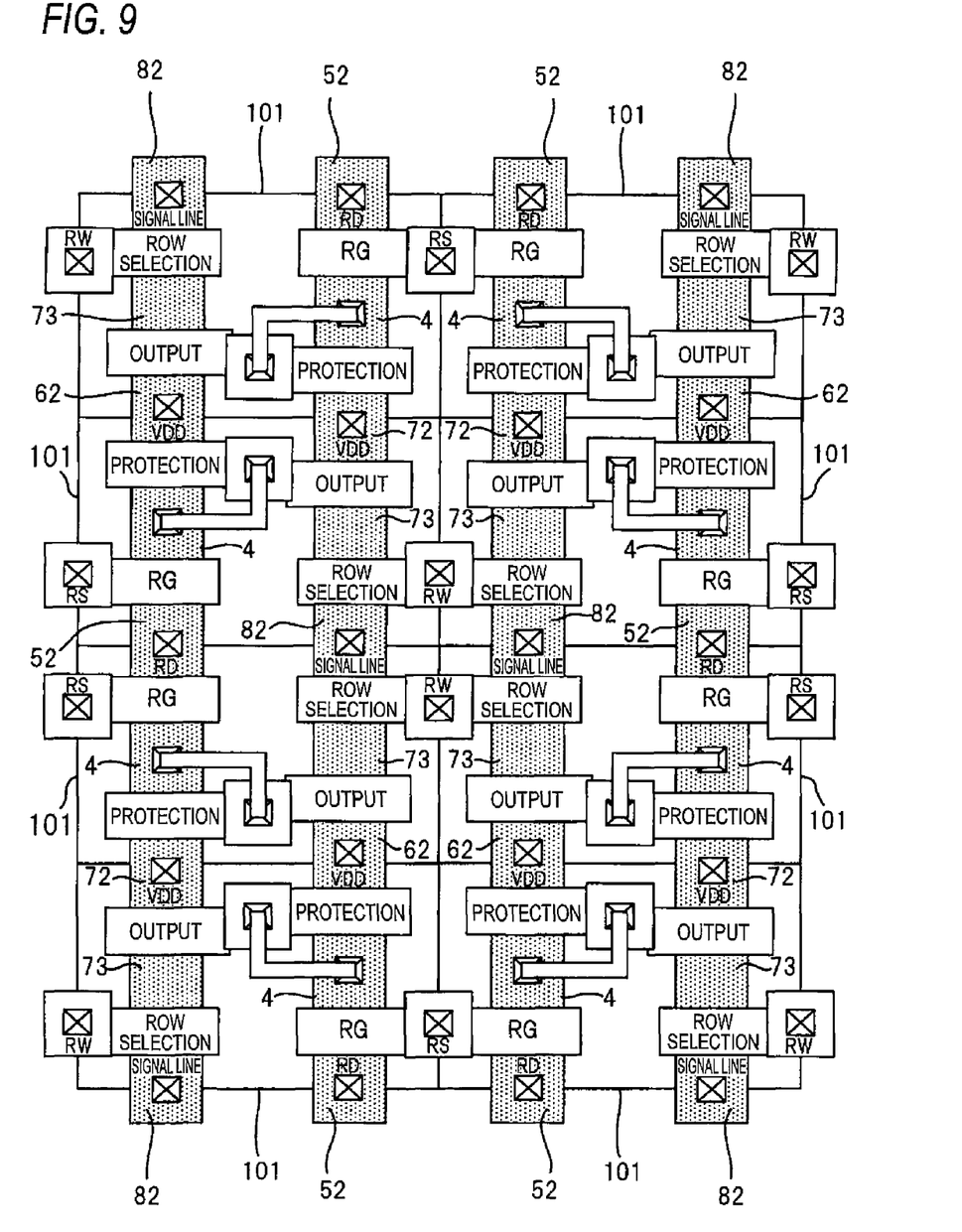
FIG. 9 A view showing a planar layout example of 4×2 pixels using the layout of FIG. 6.

FIG. 9 is a view showing a layout example of 4×2 pixels using the layout of FIG. 6. In FIG. 9, reference signs for the wires H1 to H4 and the gate electrodes of the respective transistors are omitted.

In FIG. 9, four upper pixels 100 are the same as those in the layout of FIG. 8. Four lower pixels 100 are obtained by turning the layout of FIG. 8 upside down. To two pixels 100 in which the gate electrodes 51 of the reset transistors 5 are opposed to each other and the gate electrodes 81 of the row selection transistors 8 are opposed to each other, among two longitudinally adjacent pixels 100 in FIG. 9, the drain regions 52 of the reset transistors 5 and the source regions 82 of the row selection transistors 8 are used in common.

Eight pixels 100 shown in FIG. 9 are regarded as one unit. This unit is arranged so two-dimensionally that the drain regions 52 of the reset transistors 5 and the source regions 82 of the row selection transistors 8 are used in common to two pixels 100 in which the drain regions 52 of the reset transistors 5 are opposed to each other and the source regions 82 of the row selection transistors 8 are opposed to each other. Thus, the size of each pixel can be further reduced compared with the layout of FIG. 8. According to the layout of FIG. 9, the area of each pixel 100 can be reduced by 36% compared with the layout of FIG. 2.

The protection transistor 6 has been described here as a protection circuit for preventing the potential of the gate electrode 71 of the output transistor 7 from exceeding a predetermined value by way of example. The protection circuit is not limited to the transistor. For example, a diode may be used.

Figure 10:
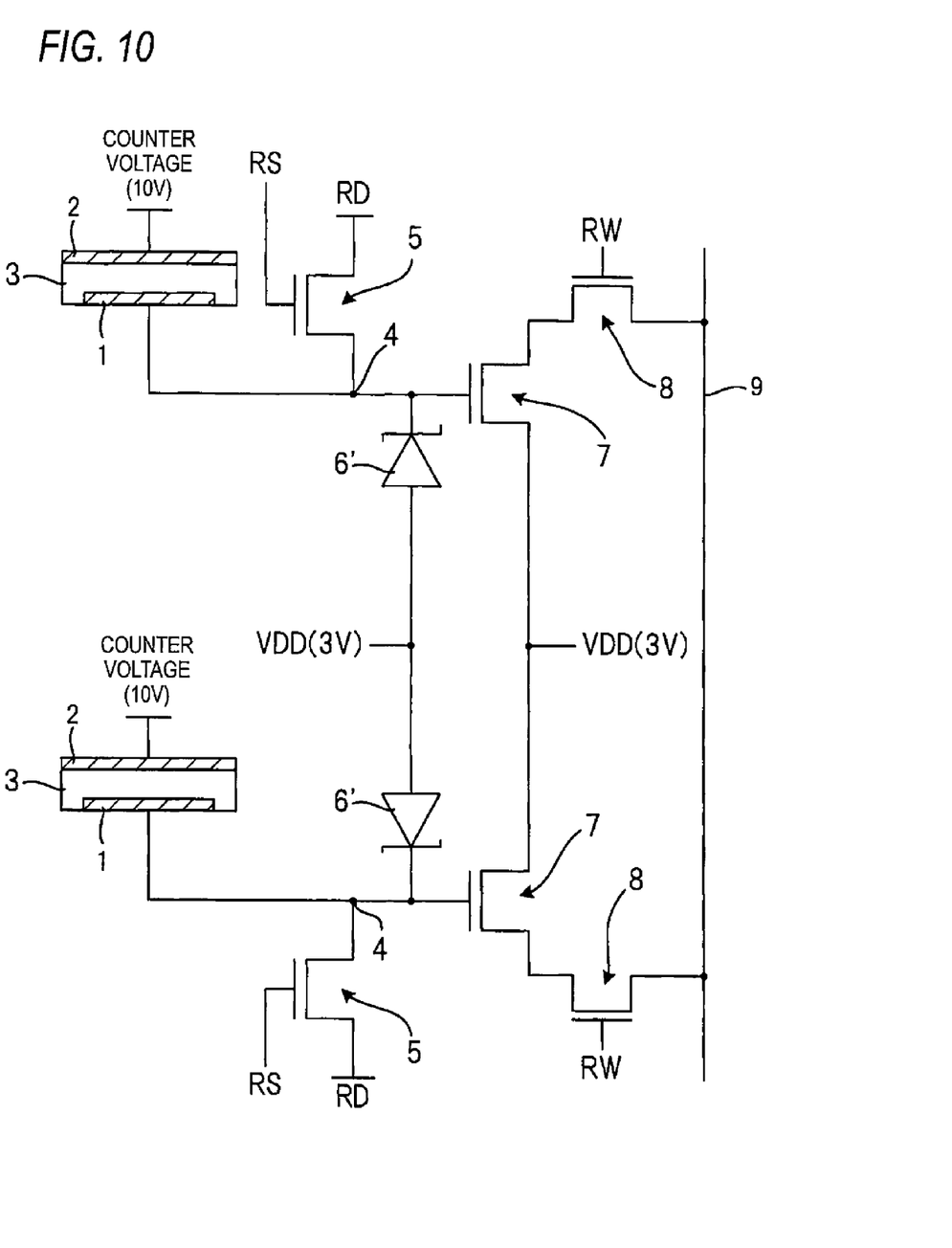
FIG. 10 A diagram corresponding to the circuit diagram of FIG. 4 in the case where a diode is used as each protection circuit.

FIG. 10 is a view corresponding to the circuit diagram of FIG. 4 in the case where a diode is used as each protection circuit. FIG. 10 is the same as the circuit diagram shown in FIG. 4 except that the protection transistors 6 are replaced by protection diodes 6'.

Each of the protection diodes 6' is made from an impurity region formed in the semiconductor substrate. The same power supply as the power supply connected to the drain regions of the output transistors 7 are connected to anodes which are impurity regions of the protection diodes 6', by wiring. Cathodes which are impurity regions of the protection diodes 6' are connected to the gate electrodes 71 of the output transistors 7 by wiring.

In the example of FIG. 10, the anodes (the impurity regions to which the power supply is connected) of the respective protection diodes 6' in two adjacent pixels 100 are used in common. In this manner, reduction in pixel size can be achieved.

Figure 11:
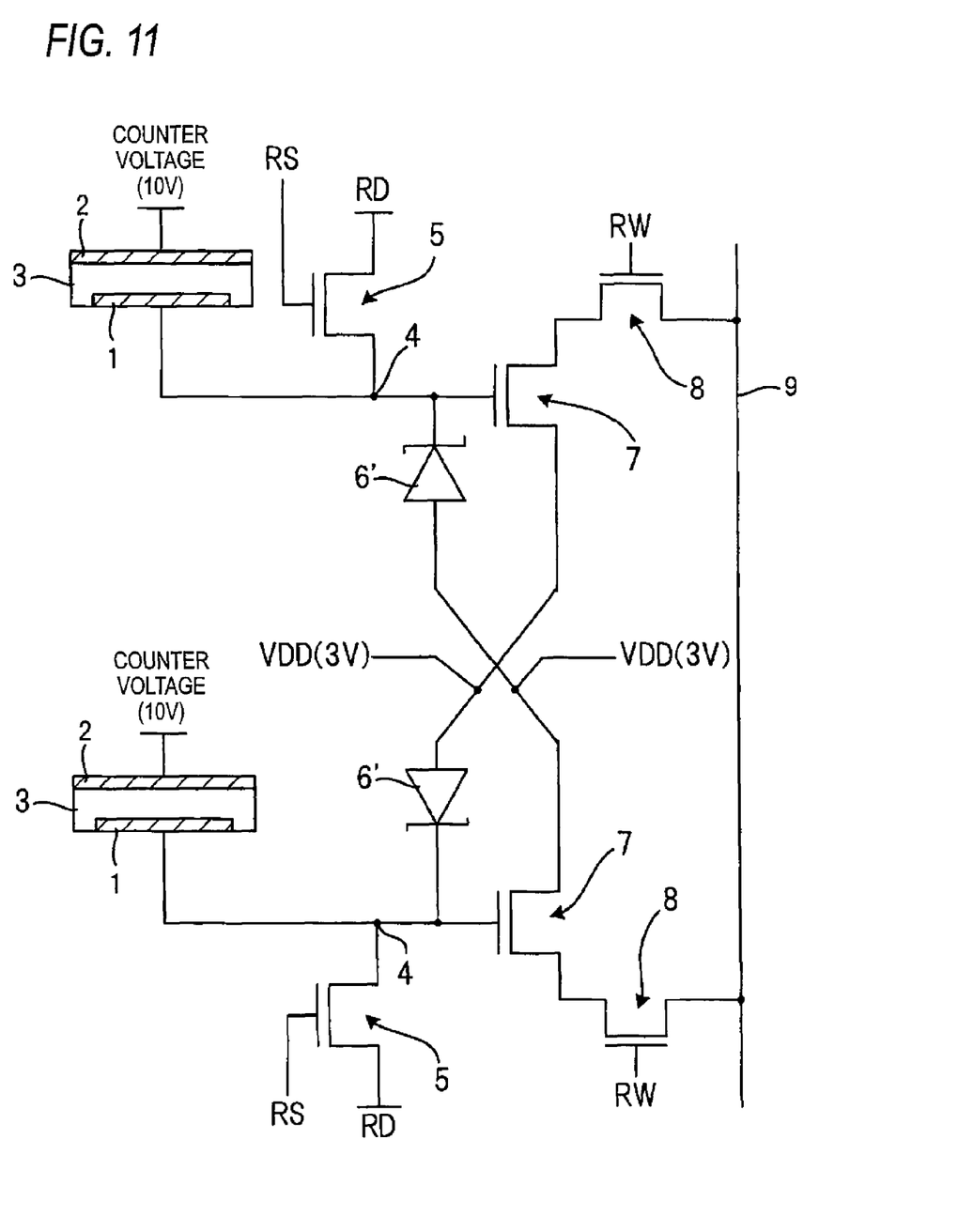
FIG. 11 A diagram corresponding to the circuit diagram of FIG. 7 in the case where a diode is used as each protection circuit.

Incidentally, even in a configuration in which the anode of each of the protection diodes 6' and the drain region 72 of each of the output transistors 7 are used in common to two adjacent pixels 100 as shown in FIG. 11, reduction in pixel size can be achieved in the same manner as in the circuit shown in FIG. 7.

Third Layout Example

Figure 12:
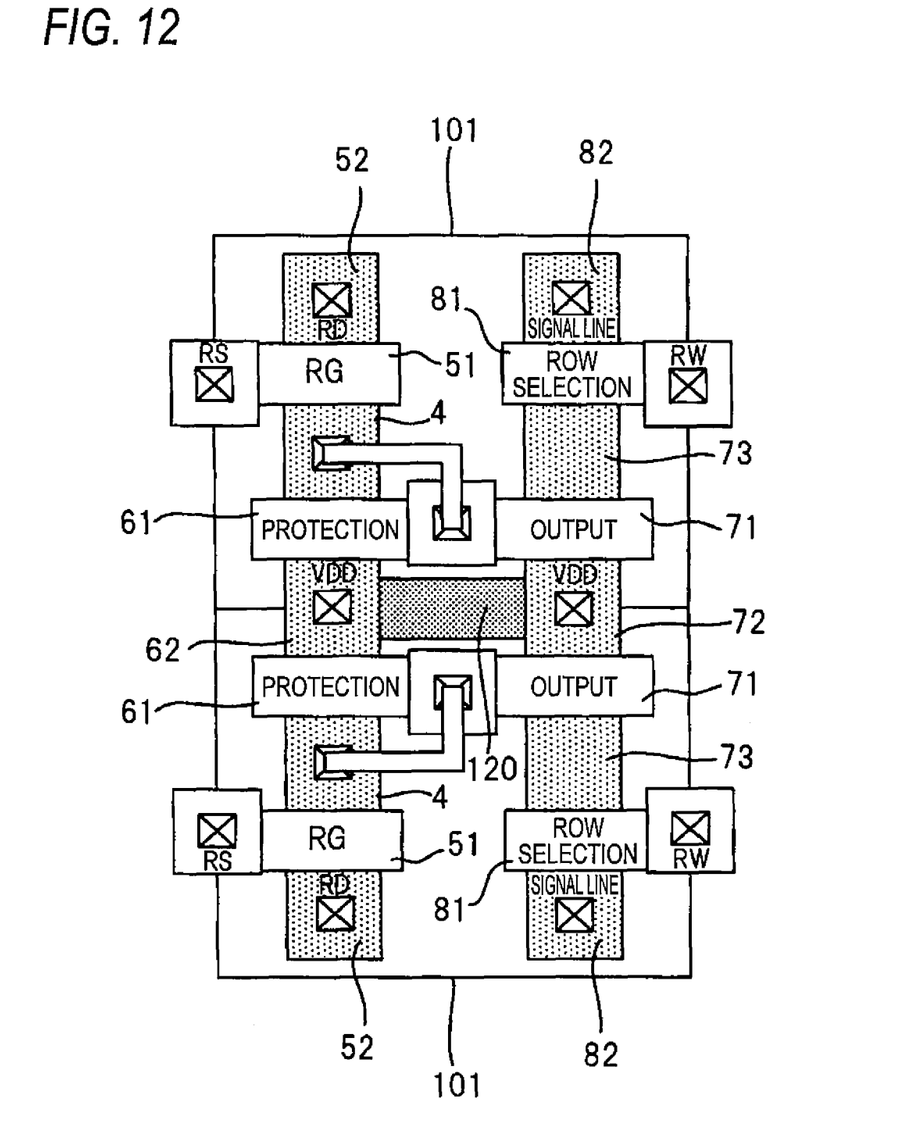
FIG. 12 A view showing a modification of the layout example shown in FIG. 3.

FIG. 12 is a view showing a modification of the layout example shown in FIG. 3. The layout shown in FIG. 12 is the same as the layout shown in FIG. 3 except that a connection region 120 made from an n-type impurity region to connect the source region 62 of each protection transistor 6 to the drain region 72 of each output transistor 7 is added between the source region 62 and the drain region 72 in the semiconductor substrate.

Since the size of each pixel in the layout of FIG. 12 is also the same as that in FIG. 3, the size of each pixel can be reduced in comparison with the layout of FIG. 2. According to the layout of FIG. 12, parasitic capacitance between the pixels can be adjusted.

Although wires connected to the power supply VDD are connected to the source region 62 and the drain region 72 respectively in the layout of FIG. 12, configuration may be made so that a wire connected to the power supply VDD is connected to any one of the source region 62, the drain region 72 and the connection region 120. In this manner, the number of wires can be reduced.

In addition, since each of the source region 62, the drain region 72 and the connection region 120 is made from an n-type impurity region, the source region 62, the drain region 72 and the connection region 120 may be formed integrally. When the source region 62, the drain region 72 and the connection region 120 are formed integrally, a portion of the integrally formed n-type impurity region opposite to the charge storage portion 4 serves as the source region of the protection transistor 6, a portion of the integrally formed n-type impurity region opposite to the impurity regions 73 serves as the drain region of the output transistor 7, and the remaining portion serves as the connection region.

Fourth Layout Example

Figure 13:
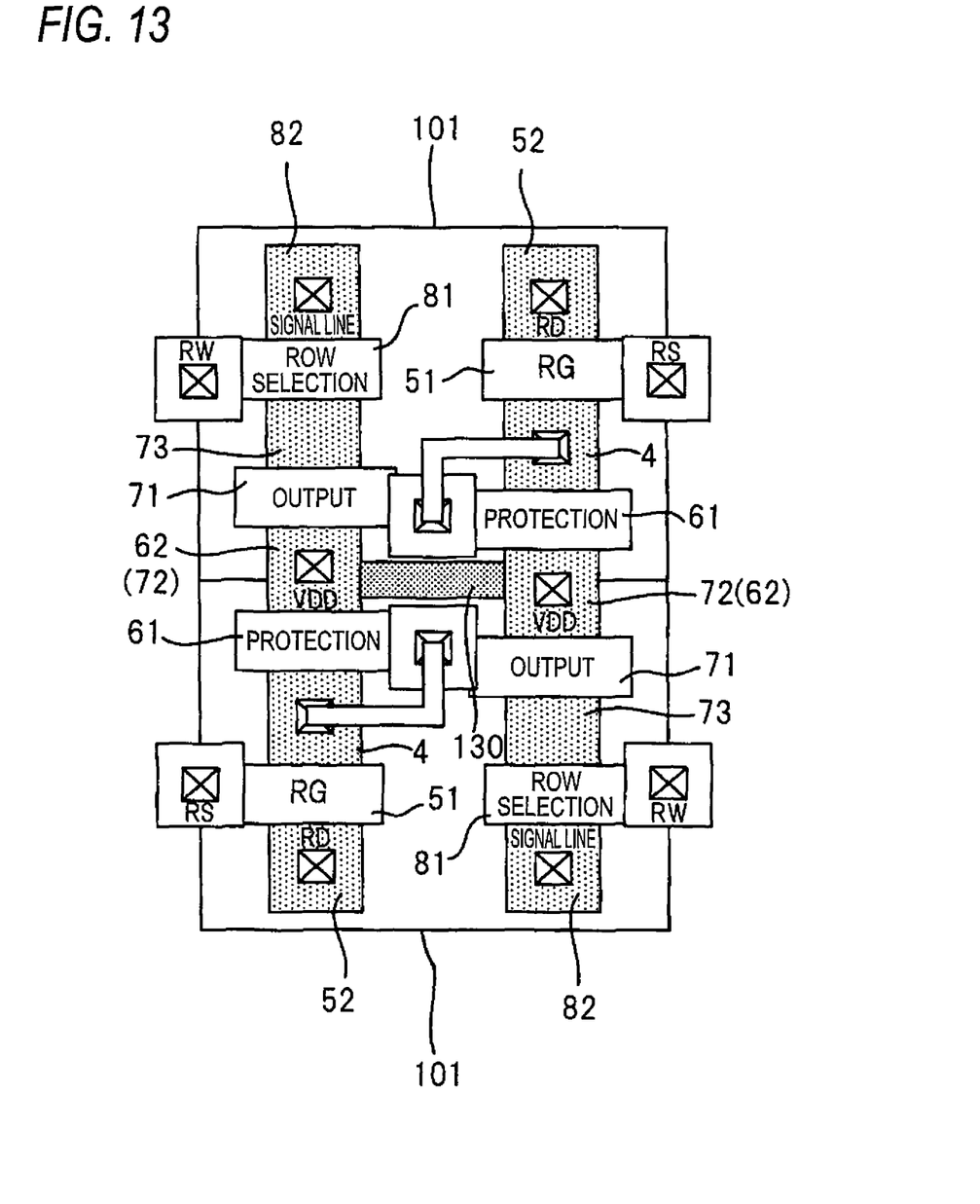
FIG. 13 A view showing a modification of the layout example shown in FIG. 6.

FIG. 13 is a view showing a modification of the layout example shown in FIG. 6. The layout shown in FIG. 13 is the same as the layout shown in FIG. 6 except that a connection region 130 made from an n-type impurity region to connect the source region 62 of each protection transistor 6 (the drain region 72 of each output transistor 7) and the drain region 72 of each output transistor 7 (the source region 62 of each protection transistor 6) to each other is added between these regions in the semiconductor substrate.

Since the size of each pixel in the layout of FIG. 13 is also the same as that in FIG. 6, the size of each pixel can be reduced in comparison with the layout of FIG. 2. In addition, the same effect as in the layout of FIG. 12 can be obtained.

Although the aforementioned description has been made in the case where the layout is made in compliance with standard design rules byway of example, exclusive processes may be constructed and exclusive design rules may be applied so that the size of each pixel can be further reduced. The same effect as in the case where the standard process rules are used can be obtained also in this case.

Locally shortening the distance between a wire connection portion in the source region or drain region of each transistor and the gate electrode, forming a connection portion to a wire on the gate electrode overlapping with the channel region of each transistor, etc. can be conceived as the exclusive processes and the exclusive design rules.

Although the configuration in this specification is made so that electric charges collected from the photoelectric conversion portion P and stored in the charge storage portion 4 are holes and all the transistors of the signal reading circuit S are formed as n-channel MOS transistors, configuration may be made so that electric charges collected from the photoelectric conversion portion P are electrons and all the transistors of the signal reading circuit S are formed as p-channel MOS transistors. In this case, a value (for example, −10V) lower than a reference voltage (for example, 0V) of the signal reading circuit is applied to the counter electrode. Also in this case, tolerance to excessive light can be enhanced by the protection circuit and the size of each pixel can be reduced by use of the aforementioned layout.

As described above, the following items are disclosed in this specification.

The disclosed solid-state imaging device is a solid-state imaging device in which pixels each including a photoelectric conversion portion formed above a semiconductor substrate and an MOS type signal reading circuit formed at the semiconductor substrate to read out a signal corresponding to electric charges generated in the photoelectric conversion portion are arranged in an array form, wherein: the photoelectric conversion portion includes a pixel electrode formed above the semiconductor substrate and split in accordance with each of the pixels, a counter electrode formed above the pixel electrode, and a photoelectric conversion layer formed between the pixel electrode and the counter electrode; a bias voltage higher than a power supply voltage of the signal reading circuit is applied to the counter electrode so that holes of the electric charges generated in the photoelectric conversion layer move to the pixel electrode; the signal reading circuit includes a charge storage portion which is formed in the semiconductor substrate and in which the holes moved to the pixel electrode are stored, an output transistor which has a gate electrode electrically connected to the charge storage portion and which outputs a signal corresponding to a potential of the charge storage portion, and a protection circuit which prevents the potential of the gate electrode from exceeding a predetermined value; the protection circuit has an impurity region formed in the semiconductor substrate and connected to a power supply; the output transistor has an impurity region formed in the semiconductor substrate and connected to the power supply; and the impurity regions of the protection circuits and the impurity regions of the output transistors are used in common to every adjacent two of the pixels so that two impurity regions formed in the semiconductor substrate and connected to the power supply are present in accordance with the two adjacent two pixels.

In the disclosed solid-state imaging device, the impurity region of the protection circuit in one of the two adjacent pixels and the impurity region of the output transistor in the other of the two pixels are used in common with each other; and the impurity region of the output transistor in one of the adjacent two pixels and the impurity region of the protection circuit in the other of the two pixels are used in common with each other.

In the disclosed solid-state imaging device, the impurity region of the protection circuit in one of the two adjacent pixels and the impurity region of the protection circuit in the other of the two pixels are used in common with each other; and the impurity region of the output transistor in one of the two adjacent pixels and the impurity region of the output transistor in the other of the two pixels are used in common with each other.

In the disclosed solid-state imaging device, the protection circuit is made from an MOS transistor; a source region of the MOS transistor is the impurity region of the protection circuit; and a gate electrode and a drain region of the MOS transistor are electrically connected to the charge storage portion respectively.

In the disclosed solid-state imaging device, the protection circuit is made from a diode; an anode of the diode is the impurity region of the protection circuit; and a cathode of the diode is electrically connected to the charge storage portion.

The disclosed imaging apparatus includes the solid-state imaging device.

INDUSTRIAL APPLICABILITY

According to the invention, it is possible to provide a stack type solid-state imaging device which can be prevented from malfunction when excessive light is incident thereto and in which the size of each pixel can be reduced, and an imaging apparatus including the solid-state imaging device.

Although the invention has been described in detail and with reference to a specific embodiment, it is obvious to those skilled in the art that various changes and modifications can be made without departing from the spirit and scope of the invention.

EXPLANATIONS OF REFERENCE SIGNS

P photoelectric conversion portion
S signal reading circuit
1 pixel electrode
2 counter electrode
3 photoelectric conversion layer
4 charge storage portion
6 protection transistor
7 output transistor
61 gate electrode of protection transistor
62 source region of protection transistor
71 gate electrode of output transistor
72 drain region of output transistor
73 source region of output transistor

The invention claimed is:

1. A solid-state imaging device in which pixels each comprising a photoelectric conversion portion formed above a semiconductor substrate and an MOS type signal reading circuit formed at the semiconductor substrate to read out a signal corresponding to electric charges generated in the photoelectric conversion portion are arranged in an array form, wherein:
   the photoelectric conversion portion comprises a pixel electrode formed above the semiconductor substrate and split in accordance with each of the pixels, a counter electrode formed above the pixel electrode, and a photoelectric conversion layer formed between the pixel electrode and the counter electrode;
   a bias voltage higher than a power supply voltage of the signal reading circuit is applied to the counter electrode so that holes of the electric charges generated in the photoelectric conversion layer move to the pixel electrode;
   the signal reading circuit comprises a charge storage portion which is formed in the semiconductor substrate and in which the holes moved to the pixel electrode are stored, an output transistor which has a gate electrode electrically connected to the charge storage portion and which outputs a signal corresponding to the potential of the charge storage portion, and a protection circuit which prevents the potential of the gate electrode from exceeding a predetermined value;
   the protection circuit has an impurity region formed in the semiconductor substrate and connected to a power supply;
   the output transistor has an impurity region formed in the semiconductor substrate and connected to the power supply; and
   the impurity regions of the protection circuits and the impurity regions of the output transistors are used in common to every adjacent two of the pixels so that two impurity regions formed in the semiconductor substrate and connected to the power supply are present in accordance with the two adjacent pixels.

2. The solid-state imaging device according to claim 1, wherein:
   the impurity region of the protection circuit in one of the two adjacent pixels and the impurity region of the output transistor in the other of the two pixels are used in common; and
   the impurity region of the output transistor in one of the two adjacent pixels and the impurity region of the protection circuit in the other of the two pixels are used in common.

3. The solid-state imaging device according to claim 1, wherein:
   the impurity region of the protection circuit in one of the two adjacent pixels and the impurity region of the protection circuit in the other of the two pixels are used in common; and
   the impurity region of the output transistor in one of the two adjacent pixels and the impurity region of the output transistor in the other of the two pixels are used in common.

4. The solid-state imaging device according to claim 1, wherein:
   the protection circuit is made from an MOS transistor;
   a source region of the MOS transistor is the impurity region of the protection circuit; and
   a gate electrode and a drain region of the MOS transistor are electrically connected to the charge storage portion respectively.

5. The solid-state imaging device according to claim 2, wherein:
   the protection circuit is made from an MOS transistor;
   a source region of the MOS transistor is the impurity region of the protection circuit; and
   a gate electrode and a drain region of the MOS transistor are electrically connected to the charge storage portion respectively.

6. The solid-state imaging device according to claim 3, wherein:
   the protection circuit is made from an MOS transistor;
   a source region of the MOS transistor is the impurity region of the protection circuit; and
   a gate electrode and a drain region of the MOS transistor are electrically connected to the charge storage portion respectively.

7. The solid-state imaging device according to claim 1, wherein:
   the protection circuit is made from a diode;
   an anode of the diode is the impurity region of the protection circuit; and
   a cathode of the diode is electrically connected to the charge storage portion.

8. The solid-state imaging device according to claim 2, wherein:
   the protection circuit is made from a diode;
   an anode of the diode is the impurity region of the protection circuit; and
   a cathode of the diode is electrically connected to the charge storage portion.

9. The solid-state imaging device according to claim 3, wherein:
   the protection circuit is made from a diode;
   an anode of the diode is the impurity region of the protection circuit; and
   a cathode of the diode is electrically connected to the charge storage portion.

10. An imaging apparatus comprising the solid-state imaging device according to claim 1.

* * * * *